(12) United States Patent
Takamine et al.

(10) Patent No.: US 7,800,460 B2
(45) Date of Patent: Sep. 21, 2010

(54) ELASTIC WAVE FILTER DEVICE AND DUPLEXER

(75) Inventors: Yuichi Takamine, Ishigawa-gun (JP); Masaru Yata, Kanazawa (JP); Yasuhisa Fujii, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 80 days.

(21) Appl. No.: 12/242,983

(22) Filed: Oct. 1, 2008

(65) Prior Publication Data

US 2009/0021322 A1 Jan. 22, 2009

Related U.S. Application Data

(63) Continuation of application No. PCT/JP2007/058606, filed on Apr. 20, 2007.

(30) Foreign Application Priority Data

May 8, 2006 (JP) ............................. 2006-129251

(51) Int. Cl.
 *H03H 9/72* (2006.01)
 *H03H 9/64* (2006.01)
(52) U.S. Cl. .................... 333/133; 333/195
(58) Field of Classification Search ......... 333/193–196; 310/313 B, 313 D
See application file for complete search history.

(56) References Cited

U.S. PATENT DOCUMENTS

| | | | |
|---|---|---|---|
| 3,600,710 A * | 8/1971 | Adler et al. ................. 333/193 |
| 4,425,554 A * | 1/1984 | Morishita et al. .......... 333/195 |
| 5,363,074 A * | 11/1994 | Higgins, Jr. ................. 333/195 |
| 5,568,002 A | 10/1996 | Kawakatsu et al. |
| 6,353,372 B1 * | 3/2002 | Baier et al. ................. 333/195 |
| 6,693,501 B2 | 2/2004 | Sawada et al. |
| 6,710,676 B2 * | 3/2004 | Yata et al. ................... 333/133 |
| 6,762,657 B2 | 7/2004 | Takamine |
| 6,815,868 B2 | 11/2004 | Shibata et al. |
| 7,042,313 B2 | 5/2006 | Yata |
| 7,212,086 B2 | 5/2007 | Nishizawa et al. |
| 7,429,905 B2 * | 9/2008 | Shibahara ................... 333/193 |

(Continued)

FOREIGN PATENT DOCUMENTS

DE 10 2004 048 715 A1 * 4/2006

(Continued)

OTHER PUBLICATIONS

Official Communication issued in International Patent Application No. PCT/JP2007/058606, mailed on Aug. 14, 2007.

*Primary Examiner*—Barbara Summons
(74) *Attorney, Agent, or Firm*—Keating & Bennett, LLP

(57) ABSTRACT

An elastic wave filter device includes first and second elastic wave filter units connected to an unbalanced terminal. The first and second elastic wave filter units include first to third IDTs and fourth to sixth IDTs, respectively. One end of the first IDT, one end of the second IDT, one end of the fourth IDT, and one end of the sixth IDT are commonly connected together and are connected to the unbalanced terminal. The second IDT and the fifth IDT are each divided into first to third sub-IDT portions in the elastic wave propagation direction, respectively. The second sub-IDT portions of the second and fifth IDTs are connected to first and second balanced terminals, respectively.

10 Claims, 5 Drawing Sheets

U.S. PATENT DOCUMENTS

| | | |
|---|---|---|
| 2001/0022544 A1 | 9/2001 | Endoh et al. |
| 2002/0079988 A1* | 6/2002 | Endou et al. .................. 333/193 |
| 2002/0140526 A1 | 10/2002 | Nakamura et al. |
| 2003/0137365 A1 | 7/2003 | Takamine |
| 2004/0155730 A1 | 8/2004 | Iwamoto et al. |
| 2006/0181369 A1* | 8/2006 | Shibahara ................... 333/195 |
| 2008/0246560 A1* | 10/2008 | Detlefsen .................... 333/195 |

FOREIGN PATENT DOCUMENTS

| | | | |
|---|---|---|---|
| EP | 1 126 605 A2 | 8/2001 | |
| JP | 60-065610 A | 4/1985 | |
| JP | 3-129915 | * 6/1991 | ................. 333/193 |
| JP | 11-097966 A | 4/1999 | |

* cited by examiner

ELASTIC WAVE FILTER DEVICE AND DUPLEXER

BACKGROUND OF THE INVENTION

1. Field of the Invention

The present invention relates to an elastic wave filter device using elastic waves, such as surface acoustic waves and boundary elastic waves, and, in particular, to a duplexer including a balanced elastic wave filter device and a boundary elastic wave filter device that have a balanced-unbalanced conversion function and that are capable of increasing the output impedance relative to the input impedance.

2. Description of the Related Art

In recent years, surface acoustic wave filters used in an RF stage of a cell phone have been required to have a balanced-unbalanced conversion function, that is, a balun function. Accordingly, longitudinally coupled resonator type surface acoustic wave filters that can easily provide a balun function and operate in a high-frequency range are widely used for a bandpass filter disposed in the RF stage.

In general, a mixer IC having a balanced input or operational input and output (hereinafter this mixer IC is referred to as a "balanced mixer IC") is connected to the output side of the surface acoustic wave filter having a balanced-unbalanced conversion function.

Typically, the input impedance of a balanced mixer IC is about 150Ω to about 200Ω. In contrast, the input and output impedance of the surface acoustic wave filter used in the RF stage is about 50Ω.

Accordingly, for a surface acoustic wave filter connected to the above-described balanced mixer IC, the output impedance should be about 150Ω to about 200Ω, which is greater than about 50Ω.

Therefore, Japanese Unexamined Patent Application Publication No. 2002-290203 describes a surface acoustic wave filter device having a balanced-unbalanced conversion function and a ratio of the input impedance to the output impedance of about 1:4. FIG. 10 is a plan view schematically illustrating the electrode structure of the surface acoustic wave filter device described in Japanese Unexamined Patent Application Publication No. 2002-290203.

A surface acoustic wave filter device 501 includes an unbalanced terminal 502, a first balanced terminal 503, and a second balanced terminal 504. First and second 3-interdigital transducer (hereinafter referred to as IDT) longitudinally coupled resonator type elastic wave filter units 505 and 506 are connected in parallel to the unbalanced terminal 502. The longitudinally coupled resonator type elastic wave filter unit 505 includes first to third IDTs 505a to 505c arranged in this order in the surface acoustic wave propagation direction. Reflectors 505d and 505e are disposed on either side of an area in which the first to third IDTs 505a to 505c are disposed in the surface acoustic wave propagation direction. In a similar manner, the longitudinally coupled resonator type elastic wave filter unit 506 includes first to third IDTs 506a to 506c and reflectors 506d and 506e.

An end of the center IDT 505b is commonly connected to an end of the center IDT 506b and is connected to the unbalanced terminal 502. In addition, an end of the first IDT 505a is commonly connected to an end of the third IDT 505c and is connected to the first balanced terminal 503. An end of the first IDT 506a is commonly connected to an end of the third IDT 506c and is connected to the second balanced terminal 504.

The first to third IDTs 505a to 505c and the first to third IDTs 506a to 506c are arranged such that the phase of a signal flowing from the unbalanced terminal 502 to the first balanced terminal 503 is different from the phase of a signal flowing from the unbalanced terminal 502 to the second balanced terminal 504 by about 180 degrees.

In the surface acoustic wave filter device 501 described in Japanese Unexamined Patent Application Publication No. 2002-290203, the ratio of the impedance on the side of the unbalanced terminal 502 defining an input terminal to the impedance on the side of the first and second balanced terminals 503 and 504 defining an output impedance can be set in the range of about 1:3 to about 1:4. That is, the ratio of the output impedance to the input impedance can be set to about 4.

However, in recent years, there has been a trend for the input impedance of a balanced mixer IC connected downstream of a surface acoustic wave filter having a balanced-unbalanced conversion function to be increased to at least about 200Ω. In some cases, the input impedance is as high as about 600Ω. Accordingly, the above-described impedance ratio needs to be greater than 4, for example, the impedance ratio may be as large as about 12. However, existing surface acoustic wave filter devices, including the surface acoustic wave filter device described in Japanese Unexamined Patent Application Publication No. 2002-290203, cannot satisfy such a requirement.

In addition, in recent years, boundary elastic wave filters have been developed which have a simplified packaging structure as compared to that of a surface acoustic wave filter. For such boundary elastic wave filters, it is similarly required that boundary elastic wave filters have a balanced-unbalanced conversion function and a high impedance ratio as described above.

SUMMARY OF THE INVENTION

To overcome the problems described above, preferred embodiments of the present invention provide a balanced elastic wave filter device having the impedance ratio, which is a ratio of the impedance on the balanced terminal side to the impedance on the unbalanced terminal side, of at least 4 so as to enable the balanced elastic wave filter device to be connected to a variety of circuits, and a duplexer including the elastic wave filter device.

According to a first preferred embodiment of the present invention, a balanced elastic wave filter device having an unbalanced terminal and first and second balanced terminals is provided. The balanced elastic wave filter device includes a first elastic wave filter unit including first to third IDTs arranged in this order in an elastic wave propagation direction, wherein the second IDT is divided into three portions in the elastic wave propagation direction so as to have first to third sub-IDT portions, and a second elastic wave filter unit including fourth to sixth IDTs arranged in this order in an elastic wave propagation direction, wherein the fifth IDT is divided into three portions in the elastic wave propagation direction so as to have first to third sub-IDT portions. One end of the first IDT, one end of the third IDT of the first elastic wave filter unit, one end of the fourth IDT and one end of the sixth IDT of the second elastic wave filter unit are connected to the unbalanced terminal, and the first to third IDTs and the fourth to sixth IDTs are arranged such that the phase of a signal transmitted from the unbalanced terminal to the first balanced terminal is different from the phase of a signal transmitted from the unbalanced terminal to the second balanced terminal by about 180 degrees. The second IDT includes a the first common bus bar that commonly connects one end of each of first to third sub-IDT portions together, the other end of the second sub-IDT portion is connected to the first balanced terminal, the other end of the first sub-IDT portion and the other end of the third sub-IDT portion are connected to a ground terminal. The fifth IDT includes a second common bus bar that commonly connects one end of each of the first to third sub-IDT portions together, the other end of the second sub-IDT portion is connected to the second balanced terminal, and the other end of the first sub-IDT portion and the other end of the third sub-IDT portion are connected to a ground terminal.

According to a second preferred embodiment of the present invention, a balanced elastic wave filter device having an unbalanced terminal and first and second balanced terminals is provided. The balanced elastic wave filter device includes a first elastic wave filter unit including first to third IDTs arranged in this order in an elastic wave propagation direction, wherein the second IDT is divided into three portions in the elastic wave propagation direction so as to have first to third sub-IDT portions, and a second elastic wave filter unit including fourth to sixth IDTs arranged in this order in an elastic wave propagation direction, wherein the fifth IDT is divided into three portions in the elastic wave propagation direction so as to have first to third sub-IDT portions. One end of the first IDT, one end of the third IDT of the first elastic wave filter unit, one end of the fourth IDT and one end of the sixth IDT of the second elastic wave filter unit are connected to the unbalanced terminal. The first to third IDTs and the fourth to sixth IDTs are arranged such that the phase of a signal transmitted from the unbalanced terminal to the first balanced terminal is different from the phase of a signal transmitted from the unbalanced terminal to the second balanced terminal by about 180 degrees. The second IDT includes a first common bus bar that commonly connects the first to third sub-IDT portions together, an end of the first sub-IDT portion and an end of third sub-IDT portion of the second IDT that are ends opposite to the ends connected to the first common bus bar are connected to the first balanced terminal, and an end of the second sub-IDT portion that is an end opposite to the end connected to the first common bus bar is connected to a ground terminal. The fifth IDT includes a second common bus bar that commonly connects one end of each of the first to third sub-IDT portions together, an end of the first sub-IDT portion and an end of third sub-IDT portion of the fifth IDT that are ends opposite to the ends connected to the second common bus bar are connected to the second balanced terminal, and an end of the second sub-IDT portion that is an end opposite to the end connected to the first common bus bar is connected to a ground terminal.

According to a third preferred embodiment of the present invention, a balanced elastic wave filter device having an unbalanced terminal and first and second balanced terminals is provided. The balanced elastic wave filter device includes a first elastic wave filter unit including first to third IDTs arranged in this order in an elastic wave propagation direction, wherein each of the first and third IDTs is divided into two portions in the elastic wave propagation direction so as to have first and second sub-IDT portions, and a second elastic wave filter unit including fourth to sixth IDTs arranged in this order in an elastic wave propagation direction, wherein each of the fourth and sixth IDTs is divided into two portions in the elastic wave propagation direction so as to have first and second sub-IDT portions. One end of the second IDT of the first elastic wave filter unit and one end of the fifth IDT of the second elastic wave filter unit are connected to the unbalanced terminal. The first, third, fourth, and sixth IDTs respectively include first to fourth common bus bars that commonly connect one end of the first sub-IDT portion to one end of the second sub-IDT portion. The other end of the second sub-IDT portion of the first IDT is commonly connected to the other end of the second sub-IDT portion of the third IDT and is connected to the first balanced terminal, and the other end of the first sub-IDT portion of the fourth IDT is commonly connected to the other end of the second sub-IDT portion of the sixth IDT and is connected to the second balanced terminal. The other end of the second sub-IDT portion of the first IDT, the other end of the first sub-IDT portion of the third IDT, the other end of the second sub-IDT portion of the fourth IDT, and the other end of the first sub-IDT portion of the sixth IDT are connected to a ground terminal. The first to sixth IDTs are arranged such that the phase of a signal transmitted from the unbalanced terminal to the first balanced terminal is different from the phase of a signal transmitted from the unbalanced terminal to the second balanced terminal by about 180 degrees.

According to a fourth preferred embodiment of the present invention, a balanced elastic wave filter device having an unbalanced terminal and first and second balanced terminals is provided. The balanced elastic wave filter device includes a first elastic wave filter unit including first to third IDTs arranged in this order in an elastic wave propagation direction, wherein each of the first and third IDTs is divided into two portions in the elastic wave propagation direction so as to have first and second sub-IDT portions, and a second elastic wave filter unit including fourth to sixth IDTs arranged in this order in an elastic wave propagation direction, wherein each of the fourth and sixth IDTs is divided into two portions in the elastic wave propagation direction so as to have first and second sub-IDT portions. One end of the second IDT of the first elastic wave filter unit and one end of the fifth IDT of the second elastic wave filter unit are connected to the unbalanced terminal. The first, third, fourth, and sixth IDTs respectively include first to fourth common bus bars that commonly connect one end of the first sub-IDT portion to one end of the second sub-IDT portion. The other end of the second sub-IDT portion of the first IDT is commonly connected to the other end of the first sub-IDT portion of the third IDT and is connected to the first balanced terminal, and the other end of the second sub-IDT portion of the fourth IDT is commonly connected to the other end of the first sub-IDT portion of the sixth IDT and is connected to the second balanced terminal. The other end of the first sub-IDT portion of the first IDT, the other end of the second sub-IDT portion of the third IDT, the other end of the first sub-IDT portion of the fourth IDT, and the other end of the second sub-IDT portion of the sixth IDT are connected to a ground terminal. The first to sixth IDTs are arranged such that the phase of a signal transmitted from the unbalanced terminal to the first balanced terminal is different from the phase of a signal transmitted from the unbalanced terminal to the second balanced terminal by about 180 degrees.

According to the third or fourth preferred embodiment of the present invention, the balanced elastic wave filter device preferably further includes seventh and eighth IDTs disposed on either side of an area in which the first to third IDTs are disposed in the elastic wave propagation direction and ninth and tenth IDTs disposed on either side of an area in which the fourth to sixth IDTs are disposed in the elastic wave propagation direction. One end of the seventh IDT, one end of the eighth IDT, one end of the ninth IDT, and one end of the tenth IDT are connected to the unbalanced terminal. That is, the third and fourth preferred embodiments of the present invention may include a 5-IDT longitudinally coupled resonator type elastic wave filter unit.

According to another preferred embodiment of the present invention, a duplexer is provided. The duplexer includes the elastic wave filter device according to one of the preferred embodiments used for a reception filter and a filter having a ladder circuit configuration used for a transmission filter.

According to the first preferred embodiment, since the first and second elastic wave filter units are connected between the unbalanced terminal and each of the first and second balanced terminals, a balanced-unbalanced conversion function is provided. In addition, each of the second IDT of the first elastic wave filter unit and the fifth IDT of the second elastic wave filter unit includes the first to third sub-IDT portions. The second sub-IDT portion of the second IDT is connected to the first balanced terminal, and the second sub-IDT portion of the fifth IDT is connected to the second balanced terminal. Therefore, the impedance on the side of the first and second balanced terminals can be significantly increased relative to the impedance on the side of the unbalanced terminal. That is, the ratio of the impedance on the side of the balanced terminals to the impedance on the side of the unbalanced terminal can be increased to about 12, which is significantly greater than about 4. Accordingly, even when a balanced mixer IC having an input impedance greater than that of an existing mixer IC is connected to the first and second balanced terminals, impedance matching can be easily achieved.

According to the second preferred embodiment, since the first and second elastic wave filter units are connected between the unbalanced terminal and each of the first and second balanced terminals, a balanced-unbalanced conversion function is provided. In addition, each of the second IDT of the first elastic wave filter unit and the fifth IDT of the second elastic wave filter unit includes the first to third sub-IDT portions. The first and third sub-IDT portions of the second IDT are connected to the first balanced terminal, and the first and third sub-IDT portions of the fifth IDT are connected to the second balanced terminal. Therefore, the impedance on the side of the first and second balanced terminals can be significantly increased relative to the impedance on the side of the unbalanced terminal. That is, the ratio of the impedance on the side of the balanced terminals to the impedance on the side of the unbalanced terminal can be increased to about 12, which is significantly greater than about 4. Accordingly, even when a balanced mixer IC having an input impedance greater than that of an existing mixer IC is connected to the first and second balanced terminals, impedance matching can be easily achieved.

According to the third preferred embodiment, since the first and second elastic wave filter units are configured as described above, a balanced-unbalanced conversion function is provided. In addition, one end of the second IDT of the first elastic wave filter unit and one end of the fifth IDT of the second elastic wave filter unit are connected to the unbalanced terminal. Each of the first and third IDTs includes the first and second sub-IDT portions. One end of the first sub-IDT portion of the first IDT is commonly connected to one end of the second sub-IDT portion of the third IDT and is connected to the first balanced terminal. The first sub-IDT portion of the fourth IDT is commonly connected to the second sub-IDT portion of the sixth IDT and is connected to the second balanced terminal. Therefore, the ratio of the impedance on the side of the balanced terminals to the impedance on the side of the unbalanced terminal can be increased to at least about 4. That is, the impedance ratio can be increased to a value up to about 12. As a result, even when a balanced mixer IC having an input impedance greater than that of an existing mixer IC is connected to the first and second balanced terminals, impedance matching can be easily achieved.

According to the fourth preferred embodiment, since the first and second elastic wave filter units are configured as described above, a balanced-unbalanced conversion function is provided. In addition, one end of the second IDT of the first elastic wave filter unit and one end of the fifth IDT of the second elastic wave filter unit are connected to the unbalanced terminal. Each of the first and third IDTs includes the first and second sub-IDT portions. One end of the second sub-IDT portion of the first IDT is commonly connected to one end of the first sub-IDT portion of the third IDT and is connected to the first balanced terminal. The second sub-IDT portion of the fourth IDT is commonly connected to the first sub-IDT portion of the sixth IDT and is connected to the second balanced terminal. Therefore, the ratio of the impedance on the side of the balanced terminals to the impedance on the side of the unbalanced terminal can be increased to at least about 4. That is, the impedance ratio can be increased to a value up to about 12. As a result, even when a balanced mixer IC having an input impedance greater than that of an existing mixer IC is connected to the first and second balanced terminals, impedance matching can be easily achieved.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention are described below with reference to the accompanying drawings.

Figure 1:
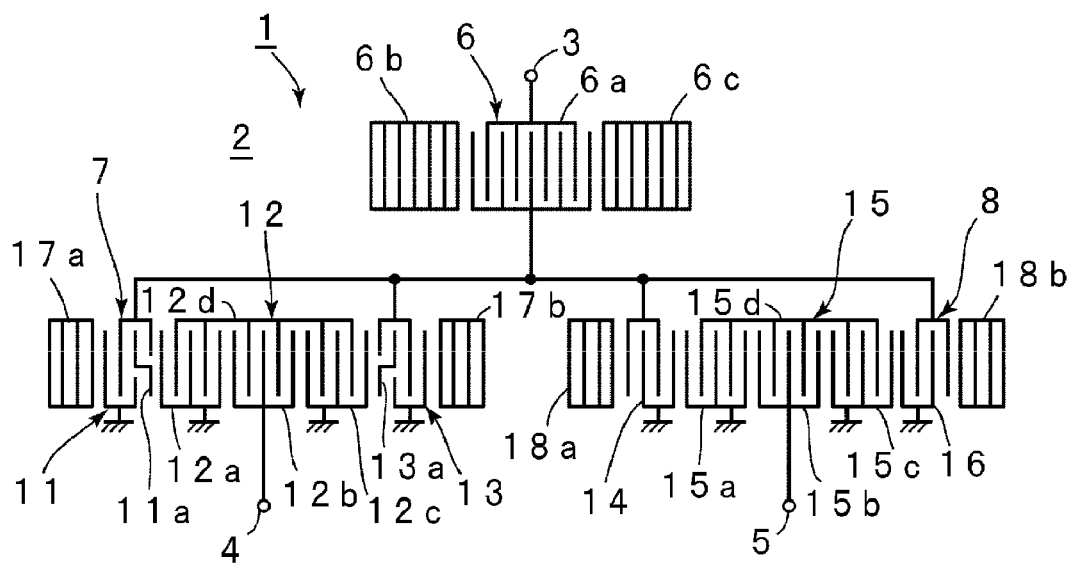
FIG. 1 is a plan view schematically illustrating the electrode structure of an elastic wave filter device according to a first preferred embodiment of the present invention.

FIG. 1 is a schematic plan view of the electrode structure of a surface acoustic wave filter device defining an elastic wave filter device according to a first preferred embodiment of the present invention.

According to the first preferred embodiment, an elastic wave filter device 1 includes a piezoelectric substrate 2. Any suitable type of piezoelectric substrate can be used for the piezoelectric substrate 2. For example, according to the present preferred embodiment, 40±5° Y-cut X-propagating $LiTaO_3$ is preferably used for the piezoelectric substrate 2.

By disposing an electrode structure shown in FIG. 1 on the piezoelectric substrate 2, a longitudinally coupled resonator type surface acoustic wave filter device can be provided. In this preferred embodiment and the preferred embodiments described below, a surface acoustic wave filter device used for a DCS receive band filter is described. This DCS receive band filter includes an input terminal functioning as an unbalanced terminal and has an impedance of about 50Ω. A balanced mixer IC having an input impedance of about 600Ω is connected to an output terminal of this DCS receive band filter. Accordingly, the impedance on the side of the first and second balanced terminals defining the output terminal must be about 600Ω. That is, a ratio of the impedance on the output terminal side, that is, on the balanced terminal side, to the impedance on the unbalanced terminal side must be about 12.

As shown in FIG. 1, the elastic wave filter device 1 includes an unbalanced terminal 3 and first and second balanced terminals 4 and 5. First and second elastic wave filter units 7 and 8 are connected to the unbalanced terminal 3 via a one-port elastic wave resonator 6. The first elastic wave filter unit 7 includes first to third IDTs 11 to 13 arranged in this order in the elastic wave propagation direction. In addition, the second elastic wave filter unit 8 includes fourth to sixth IDTs 14 to 16 arranged in this order in the elastic wave propagation direction.

Each of the first and second elastic wave filter units is preferably a 3-IDT longitudinally coupled resonator type elastic wave filter unit including three IDTs. Reflectors 17a and 17b are disposed at either end of the elastic wave filter unit 7, and reflectors 18a and 18b are disposed at either end of the elastic wave filter unit 8.

According to the present preferred embodiment, the one-port elastic wave resonator 6 is not necessarily provided. However, one end of the one-port elastic wave resonator 6 is preferably connected to the unbalanced terminal 3. Note that, according to the present preferred embodiment, the one-port elastic wave resonator 6 preferably includes an IDT 6a and reflectors 6b and 6c disposed on either side of the IDT 6a. However, the reflectors 6b and 6c are not necessarily provided.

According to the present preferred embodiment, by connecting the one-port elastic wave resonator 6 in series between the unbalanced terminal 3 and each of the first and second elastic wave filter units 7 and 8, the attenuation in the vicinity of the passband is increased. Thus, the sharpness of the filter characteristic can be increased. In addition, the impedance in the passband can be effectively controlled.

The other end of the one-port elastic wave resonator 6 is preferably connected to each of the first and second elastic wave filter unit 7 and 8. More specifically, one end of the first IDT 11 of the first elastic wave filter unit 7 is commonly connected to one end of the third IDT 13 of the first elastic wave filter unit 7 and is connected to the unbalanced terminal 3 via the one-port elastic wave resonator 6. In addition, one end of the fourth IDT 14 of the second elastic wave filter unit 8 is commonly connected to one end of the sixth IDT 16 of the second elastic wave filter unit 8 and is connected to the unbalanced terminal 3 via the one-port elastic wave resonator 6.

The other end of the first IDT 11 and the other end of the third IDT 13 are connected to the ground potential. Similarly, the other end of the fourth IDT 14 and the other end of the sixth IDT 16 are connected to the ground potential. Accordingly, the first and second elastic wave filter units 7 and 8 are connected to the unbalanced terminal 3 in parallel.

In contrast, the second IDT 12 is divided into three portions in the elastic wave propagation direction so as to include first to third sub-IDT portions 12a to 12c. The second IDT 12 includes a first common bus bar 12d. One end of each of the first to third sub-IDT portions 12a to 12c is connected to the one end of each of the others of the first to third sub-IDT portions 12a to 12c via the first common bus bar 12d.

The other end of the second sub-IDT portion 12b located in the approximate center, which is an end opposite to the end thereof connected to the first common bus bar 12d, is connected to the first balanced terminal 4. The other end of the first sub-IDT portion 12a and the other end of the third sub-IDT portion 12c, which are ends opposite to the ends thereof connected to the first common bus bar 12d, are connected to the ground potential.

In the first elastic wave filter unit 7, on the end of the first IDT 11 and the end of the third IDT 13 adjacent to the second IDT 12, series weighting is preferably provided. That is, as schematically shown, by providing floating electrode fingers 11a and 13a, series weighting is provided. The series weighting is not necessarily provided. However, by performing series weighting, the state between the IDTs of the first elastic wave filter unit can be adjusted to be substantially the same as the state between the IDTs of the second elastic wave filter unit 8. Thus, the phase balance and the amplitude balance can be greatly improved.

Similarly, in the second elastic wave filter unit 8, the fifth IDT 15 located in the approximate center is divided into three portions in the elastic wave propagation direction so as to have first to third sub-IDT portions 15a to 15c. The fifth IDT 15 includes a second common bus bar 15d. One end of each of the first to third sub-IDT portions 15a to 15c is commonly connected to the one end of each of the others of the first to third sub-IDT portions 15a to 15c via the second common bus bar 15d. The other end of the second sub-IDT portion 15b, which is an end opposite to the end thereof connected to the second common bus bar 15d, is connected to the second balanced terminal 5. One end of the first sub-IDT portion 15a and one end of the third sub-IDT portion 15c are connected to the second common bus bar 15d. The other end of the first sub-IDT portion 15a and the other end of the third sub-IDT portion 15c are connected to the ground potential.

According to the present preferred embodiment, the fourth and sixth IDTs 14 and 16 are inverted with respect to the first and third IDTs 11 and 13, respectively. Thus, the phase of a signal flowing from the unbalanced terminal 3 to the first balanced terminal 4 is different from a signal flowing from the unbalanced terminal 3 to the second balanced terminal 5 by about 180 degrees. Consequently, the elastic wave filter device 1 has a balanced-unbalanced conversion function.

In addition, according to the present preferred embodiment, as described above, the second IDT 12 and the fifth IDT 15 include the first to third sub-IDT portions 12a to 12c and the first to third sub-IDT portions 15a to 15c, respectively. In addition, the first to third sub-IDT portions are connected in series. Accordingly, the impedance on the side of the balanced terminals 4 and 5 is preferably about 12 times the impedance on the side of the unbalanced terminal 3.

That is, the ratio of the impedance on the side of the first and second balanced terminal 4 and 5 defining the output terminal to the impedance on the side of the unbalanced terminal 3 defining the input terminal can be about 12. Accordingly, when the elastic wave filter device 1 is connected to a balanced mixer IC having an input impedance of about 600Ω with respect to the balanced terminals 4 and 5, impedance matching can be easily achieved. In addition, each of the first elastic wave filter unit 7 and the second elastic wave filter unit 8 has a bilaterally symmetrical configuration in the elastic wave direction. Thus, no significant ripples occur in the passband. This is described below with reference to a particular preferred embodiment.

The first and second elastic wave filter units 7 and 8 and the one-port elastic wave resonator 6 having the following specifications are provided on the above-described piezoelectric substrate. Subsequently, the elastic wave filter device 1 is produced.

Specifications of First and Second Elastic Wave Filter Units 7 and 8 a) the crossing width is about 29.3$\lambda$I, where $\lambda$I denotes the wavelength determined by the electrode finger pitch of the IDT.

b) the number of electrode fingers of each of the IDTs 11, 13, 14, and 16 is 28, wherein five continuous electrode fingers adjacent to a neighboring IDT define a narrow-pitch finger electrode portion in which the finger electrode pitch is less than that of the other electrode fingers in the IDT.

c) the number of electrode fingers of each of the IDTs 12 and 15 is 27, wherein four continuous electrode fingers adjacent to a neighboring IDT define a narrow-pitch finger electrode portion.

d) the number of electrode fingers of each of the reflectors 17a, 17b, 18a, and 18b is 85, wherein the metallization ratio is about 0.67, and the metallization ratio of the narrow-pitch finger electrode portion is about 0.65.

e) the thickness of an electrode layer is about 0.086$\lambda$I, wherein the numbers of electrode fingers of each of the first to third sub-IDT portions of the second IDT 12 and the fifth IDT 15 are as follows: (the first sub-IDT portion):(the second sub-IDT portion):(the third sub-IDT portion)=7:13:7

Figure 2:
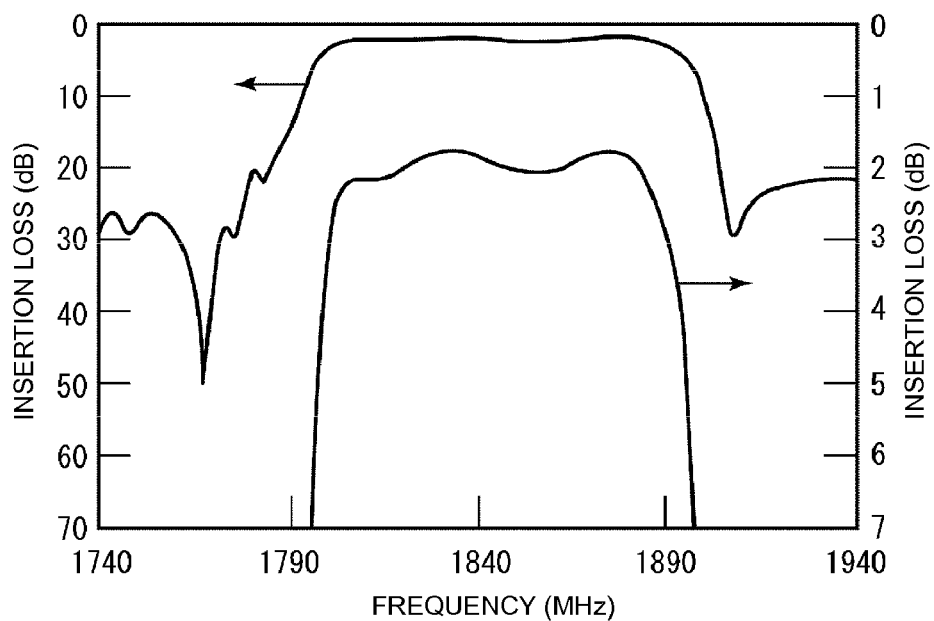
FIG. 2 is a diagram illustrating an attenuation-frequency characteristic of the elastic wave filter device according to the first preferred embodiment of the present invention.

Specifications of One-port Elastic Wave Resonator 6 crossing width: about 24.8$\lambda$I,
the number of electrode fingers of the IDT: 221
the number of electrode fingers of the reflector: 15,
the metallization ratio: about 0.70, and
the thickness of an electrode layer: about 0.089$\lambda$I The filter characteristic of the elastic wave filter device 1 according to the present preferred embodiment having the above-described specifications is shown in FIG. 2. The impedance characteristic of the elastic wave filter device 1 is shown in FIGS. 3A and 3B.

As shown in FIG. 2, in the elastic wave filter device according to the present preferred embodiment, a ripple or other disturbance does not occur in the passband. Thus, an excellent bandpass filter characteristic can be obtained.

Figure 3A:
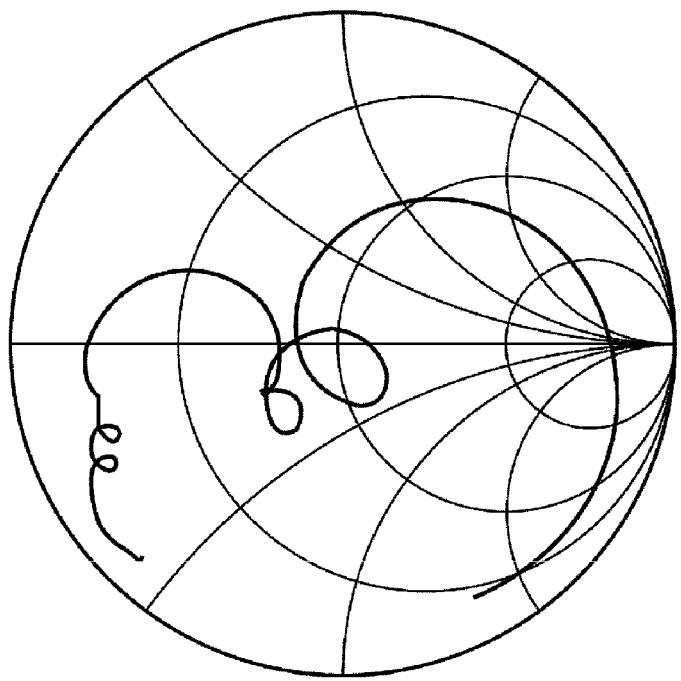
FIGS. 3A and 3B illustrate an impedance Smith chart on an unbalanced terminal side of the elastic wave filter device and an impedance Smith chart on a balanced terminal side of the elastic wave filter device according to the first preferred embodiment of the present invention.
Figure 3B:
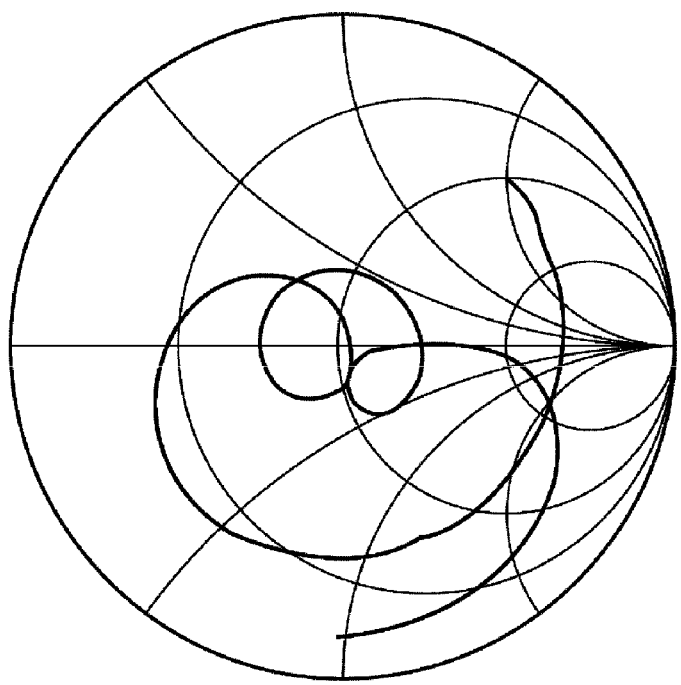

In addition, FIG. 3A is an impedance Smith chart diagram indicating the impedance characteristic on the side of the unbalanced terminal, and FIG. 3B is an impedance Smith chart diagram indicating the impedance characteristic on the side of the balanced terminals 4 and 5 defining the output terminal. As shown in FIGS. 3A and 3B, although the ratio between the impedance of the unbalanced terminal 3 and the impedance of the balanced terminals 4 and 5 is as large as about 1:12, impedance matching is substantially achieved. That is, it can be seen that the resonance characteristic in the passband is concentrated in the center of the impedance Smith chart.

Accordingly, according to the present preferred embodiment, by dividing the second IDT 12 and the fifth IDT 15 into the three first to third sub-IDT portions 12a to 12c and the three first to third sub-IDT portions 15a to 15c, respectively, a significantly high impedance ratio can be obtained. In addition, ripples do not substantially occur in the passband, and impedance matching can be easily achieved.

While the first preferred embodiment has been described with reference to the balanced terminal having an impedance of about 600Ω, an elastic wave filter device having an impedance of about 400Ω to about 1200Ω can be produced by adjusting the parameters, such as the number of electrode pairs, for example.

Figure 11:
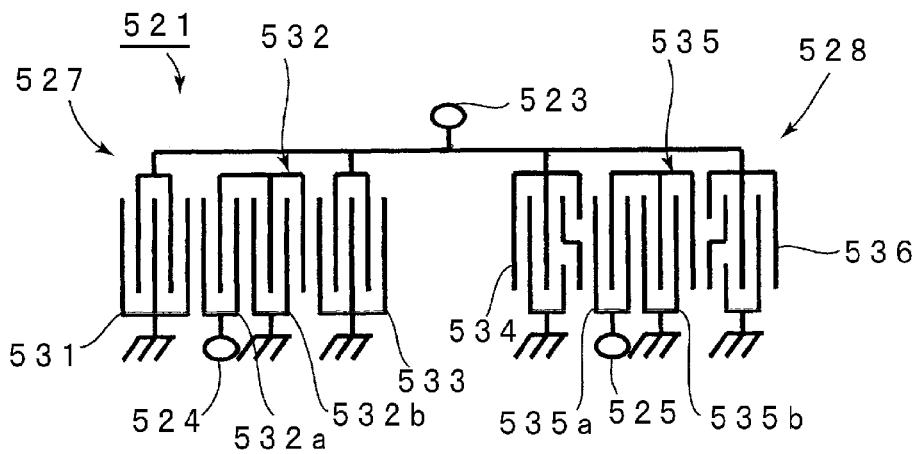
FIG. 11 is a schematic plan view of the electrode structure of an elastic wave filter device of a comparative example.

In order to increase the above-described impedance ratio between the unbalanced terminal and the balanced terminal, the structure of an elastic wave filter device 521 of a comparative example, as shown in FIG. 11, can preferably be provided. The elastic wave filter device 521 of the comparative example includes an unbalanced signal terminal 523, first and second balanced terminals 524 and 525, and first and second elastic wave filter units 527 and 528. Each of the first and second elastic wave filter units 527 and 528 is a 3-IDT longitudinally coupled resonator type elastic wave filter unit. The first elastic wave filter unit 527 includes first to third IDTs 531 to 533 arranged in this order in the elastic wave propagation direction. The second elastic wave filter unit includes fourth to sixth IDTs 534 to 536. Here, the second IDT 532 preferably includes first and second sub-IDT portions 532a and 532b, and the fifth IDT 535 preferably includes first and second sub-IDT portions 535a and 535b.

By dividing the IDTs into two portions, the IDTs 532 and 535 each including the first and second sub-IDT portions can be provided. The remaining structure of the elastic wave filter device of the comparative example is similar to that of the above-described preferred embodiment. The attenuation-frequency characteristic of this elastic wave filter device was measured. Note that the structures of the elastic wave resonator 6 and the reflector are also similar to those of the above-described preferred embodiment. However, these are not shown in FIG. 11.

Figure 12:
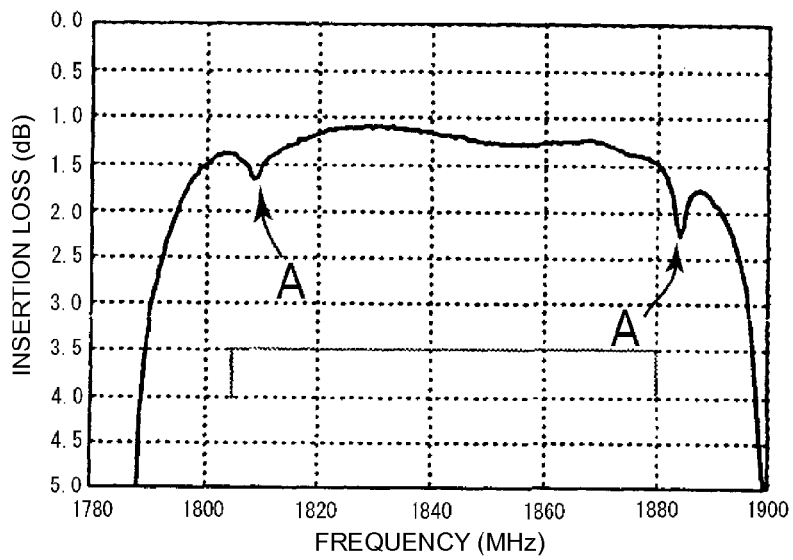
FIG. 12 is a diagram illustrating an attenuation-frequency characteristic of the elastic wave filter device of the comparative example.

FIG. 12 illustrates the attenuation-frequency characteristic of the elastic wave filter device 521 of the comparative example measured in the above-described manner. As shown in FIG. 12, spike-shaped ripples indicated by arrows A and A occur in the passband.

In the elastic wave filter device 521 of the comparative example, each of the first elastic wave filter unit 527 and the second elastic wave filter unit 528 is not bilaterally symmetrical with respect to the approximate center thereof. For this reason, the significant spike-shaped ripples occur.

In contrast, in the elastic wave filter device 1 according to the first preferred embodiment, as shown in FIG. 2, no ripples occur in the passband. This is because each of the second IDT 12 and the fifth IDT 15 is configured such that the first to third sub-IDT portions have a bilaterally symmetrical arrangement.

Figure 4:
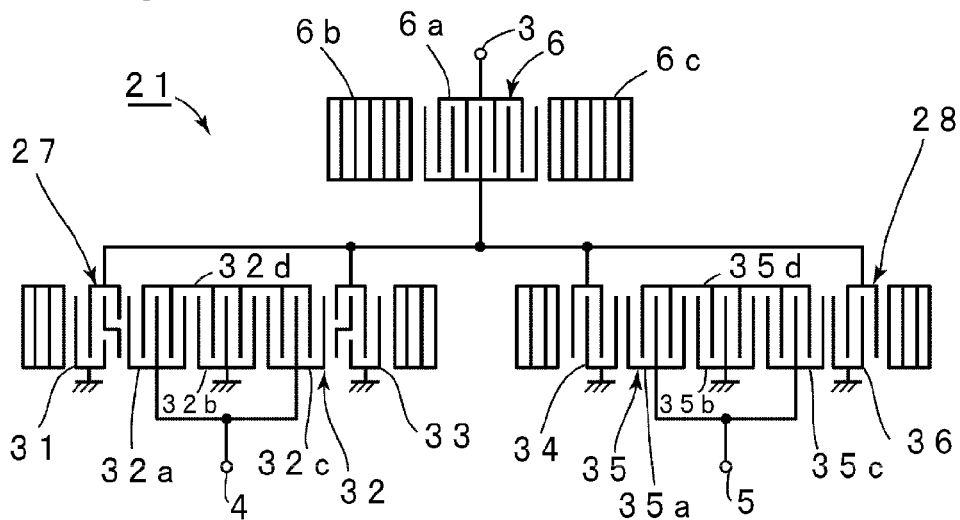
FIG. 4 is a plan view schematically illustrating the electrode structure of an elastic wave filter device according to a second preferred embodiment of the present invention.

FIG. 4 is a schematic plan view of the electrode structure of an elastic wave filter device according to a second preferred embodiment of the present invention. An elastic wave filter device 21 according to the second preferred embodiment corresponds to a modification of the elastic wave filter device 1 according to the first preferred embodiment. Accordingly, only the different features are described. Descriptions of the features that are substantially the same as those of the elastic wave filter device 1 according to the first preferred embodiment are not repeated in order to simplify the description of the elastic wave filter device 21 according to the second preferred embodiment.

In the elastic wave filter device 21, first and second elastic wave filter units 27 and 28 are connected to the elastic wave resonator 6. The first elastic wave filter unit 27 includes first to third IDTs 31 to 33 arranged in this order in the elastic wave propagation direction. The second elastic wave filter unit 28 includes fourth to sixth IDTs 34 to 36 arranged in this order in the elastic wave propagation direction.

In the second preferred embodiment, the second IDT 32 arranged in the approximate center of the first elastic wave filter unit 27 includes first to third sub-IDT portions 32a to 32c, which are commonly connected together using a first common bus bar 32d.

In addition, the first and third sub-IDT portions 32a and 32c are arranged on either side of the second IDT 32. An end of the first sub-IDT portion 32a and an end of the third sub-IDT portion 32c, which are ends opposite to the ends connected to the first common bus bar 32d, are connected to the first balanced terminal 4. The second sub-IDT portion 32b is arranged in the approximate center of the second IDT 32. An end of the second sub-IDT portion 32b, which is an end opposite to the end connected to the common bus bar 32d, is connected to the ground potential.

Similarly, in the second elastic wave filter unit 28, the fifth IDT 35, which is arranged between the fourth to sixth IDTs 34 to 36, includes first to third sub-IDT portions 35a to 35c and a second bus bar 35d. An end of the first sub-IDT portion 35a and an end of the third sub-IDT portion 35c, which are ends opposite to the ends connected to the common bus bar 35d, are connected to the second balanced terminal 5. An end of the second sub-IDT portion 35b arranged in the approximate center, which is an end opposite to the end connected to the second bus bar 35d, is connected to the ground potential.

The first to sixth IDTs 31 to 36 are configured so that the phase of a signal flowing from the unbalanced terminal 3 to the first balanced terminal 4 is different from the phase of a signal flowing from the unbalanced terminal 3 to the second balanced terminal 5 by 180 degrees.

Accordingly, the elastic wave filter device 21 has a balanced-unbalanced conversion function. In addition, similar to the first preferred embodiment, when the impedance on the side of the unbalanced terminal 3 is about 50Ω, the impedance on the side of the balanced terminals 4 and 5 can be set in the range of about 400Ω to about 1200Ω. Furthermore, in the second preferred embodiment, each of the first elastic wave filter unit 27 and the second elastic wave filter unit 28 is configured to have a bilaterally symmetrical arrangement. Accordingly, unwanted ripples are not likely to occur in the passband.

Figure 5:
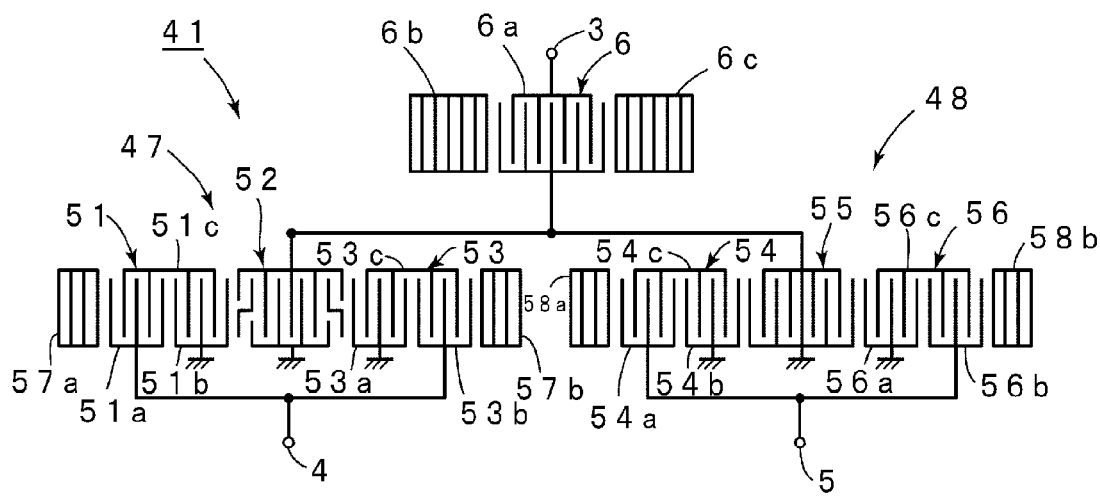
FIG. 5 is a plan view schematically illustrating the electrode structure of an elastic wave filter device according to a third preferred embodiment of the present invention.

FIG. 5 is a schematic plan view of the electrode structure of an elastic wave filter device according to a third preferred embodiment of the present invention.

Similar to the first preferred embodiment, in an elastic wave filter device 41 according to the third preferred embodiment, the electrode structure shown in the drawing is provided on a piezoelectric structure. In this manner, the elastic wave filter device including first and second longitudinally coupled resonator type elastic wave filter units can be provided.

According to the third preferred embodiment, the elastic wave filter device 41 includes an unbalanced terminal 3 and first and second balanced terminals 4 and 5. Similar to the first preferred embodiment, a one-port elastic wave resonator 6 is connected to the unbalanced terminal 3. First and second 3-IDT longitudinally coupled resonator type elastic wave filter units 47 and 48 are connected to the unbalanced terminal 3 via the one-port elastic wave resonator 6.

The first elastic wave filter unit 47 includes first to third IDTs 51 to 53 arranged in this order in the elastic wave propagation direction. The IDT 51 includes first and second sub-IDT portions 51a and 51b produced by dividing the IDT 51 into two portions in the elastic wave propagation direction, and the IDT 53 includes first and second sub-IDT portions 53a and 53b produced by dividing the IDT 53 into two portions in the elastic wave propagation direction. The first IDT 51 includes a common bus bar 51c arranged to commonly connect one end of the sub-IDT portion 51a to one end of the sub-IDT portion 51b. Similarly, the third IDT 53 includes a common bus bar 53c. One end of the second IDT 52 is connected to the unbalanced terminal 3 via the one-port elastic wave resonator 6. The other end of the IDT 52 is connected to the ground potential.

In the first IDT 51, the first and second sub-IDT portions 51a and 51b are connected in series using the common bus bar 51c. Similarly, in the third IDT 53, the first and second sub-IDT portions 53a and 53b are connected in series using the common bus bar 53c. Here, the first sub-IDT portion 51a and the second sub-IDT portion 53a are located on either side of the third IDT 53 in the elastic wave propagation direction, and the other end of the first sub-IDT portion 51a is commonly connected to the other end of the second sub-IDT portion 53b and is connected to the first balanced terminal 4. In addition, the other end of the second sub-IDT portion 51b located towards the inside and the other end of the first sub-IDT portion 53a located towards the inside are connected to the ground potential.

Similarly, in the second elastic wave filter unit 48, one end of the fifth IDT 55, which is arranged in the approximate center, is connected to the unbalanced terminal 3 via the one-port elastic wave resonator 6. The other end of the fifth IDT 55 is connected to the ground potential. In the fourth IDT 54, first and second sub-IDT portions 54a and 54b are connected in series via a common bus bar 54c. An end of the first sub-IDT portion 54a opposite to the end thereof connected to the common bus bar 54c is commonly connected to an end of a second sub-IDT portion 56b of an IDT 56 opposite to the end thereof connected to a common bus bar 56c and is connected to the second balanced terminal 5. In addition, in the second elastic wave filter unit 48, the other end of the second sub-IDT portion 54b located towards the inside is connected to the ground potential. Furthermore, the other end of a first sub-IDT portion 56a is connected to the ground potential.

In the first elastic wave filter unit 47, reflectors 57a and 57b are disposed on either side of an area in which the first to third IDTs 51 to 53 are disposed in the elastic wave propagation direction. Similarly, in the second elastic wave filter unit 48, reflectors 58a and 58b are disposed.

According to the third preferred embodiment, the first to sixth IDTs 51 to 56 are arranged such that the phase of a signal flowing from the unbalanced terminal 3 to the first balanced terminal 4 is different from the phase of a signal flowing from the unbalanced terminal 3 to the second balanced terminal 5 by about 180 degrees. More specifically, the phase of the fifth IDT 55 is preferably inverted from that of the second IDT 52. In this manner, a balanced-unbalanced conversion function is achieved.

In addition, as described above, the first and second elastic wave filter units 47 and 48 are connected to the unbalanced terminal 3 in parallel. The first elastic wave filter unit 47 is configured such that the first and third IDTs 51 and 53, which are located on either side of the elastic wave filter unit 47 in the elastic wave propagation direction, include the first and second sub-IDT portions 51a and 51b connected in series and the first and second sub-IDT portions 53a and 53b connected in series, respectively. In addition, the first elastic wave filter unit 48 is configured such that the fourth and sixth IDTs 54 and 56, which are located on either side of the elastic wave filter unit 48 in the elastic wave propagation direction, include the first and second sub-IDT portions 54a and 54b connected in series and the first and second sub-IDT portions 56a and 56b connected in series, respectively. The other end of the first sub-IDT portion 51a of the first IDT 51 is commonly connected to the other end of the second sub-IDT portion 53b of the third IDT 53 and is connected to the first balanced terminal 4. The other end of the first sub-IDT portion 54a of the fourth IDT 54 is commonly connected to the other end of the second sub-IDT 56b of the IDT 56 and is connected to the second balanced terminal 5. Accordingly, when the impedance on the side of the unbalanced terminal 3 is about 50Ω, the impedance of the balanced terminals 4 and 5 can be set in the range from about 400Ω to about 1200Ω.

In addition, according to the third preferred embodiment, the symmetrical property of each of the first elastic wave filter unit 47 and the second elastic wave filter unit 48 is increased. Therefore, unwanted ripples rarely occur in the passband. In addition, according to the third preferred embodiment, the one-port elastic wave resonator 6 is not necessarily provided. Furthermore, the reflectors 6b and 6c are not necessarily provided in the one-port elastic wave resonator 6.

Figure 6:
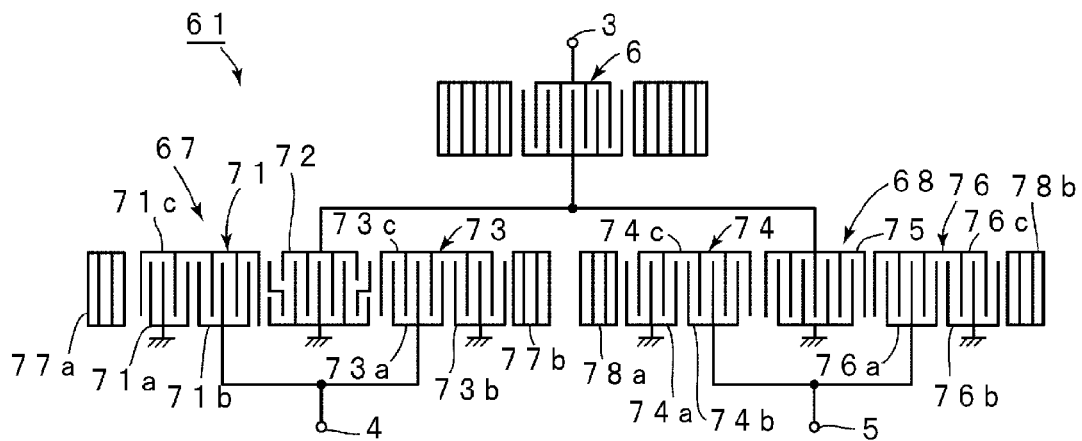
FIG. 6 is a plan view schematically illustrating the electrode structure of an elastic wave filter device according to a fourth preferred embodiment of the present invention.

FIG. 6 is a schematic plan view of the electrode structure of an elastic wave filter device according to a fourth preferred embodiment of the present invention. An elastic wave filter device 61 according to the fourth preferred embodiment corresponds to a modification of the elastic wave filter device 41 according to the third preferred embodiment. Accordingly, only different features are described. Descriptions of the remaining features are not repeated since the descriptions are substantially the same as those of the third preferred embodiment.

According to the fourth preferred embodiment, the elastic wave filter device 61 includes first and second elastic wave filter units 67 and 68 in instead of the first and second elastic wave filter units 47 and 48.

Each of the first and second elastic wave filter units 67 and 68 is a 3-IDT longitudinally coupled resonator type elastic wave filter unit. The first elastic wave filter unit 67 includes first to third IDTs 71 to 73 disposed along the elastic wave propagation direction. Reflectors 77a and 77b are disposed at either side of an area in which the IDTs 71 to 73 are disposed in the elastic wave propagation direction.

According to the fourth preferred embodiment, the first IDT 71 includes first and second sub-IDT portions 71a and 71b produced by dividing the first IDT 71 into two portions in the elastic wave direction. The third IDT 73 includes first and second sub-IDT portions 73a and 73b produced by dividing the first IDT 73 into two portions in the elastic wave direction. According to the fourth preferred embodiment, the sub-IDT portion located in the center and adjacent to the second IDT 72 is connected to the first balanced terminal 4. That is, the second sub-IDT portion 71b of the first IDT 71 is commonly connected to the first sub-IDT portion 73a of the third IDT 73 and is connected to the first balanced terminal 4. In addition, the other end of the sub-IDT portion located outside in the elastic wave propagation direction, that is, the other end of the first sub-IDT portion 71a of the first IDT 71, is connected to the ground potential. The one end of the first sub-IDT portion 71a is connected to a common bus bar 71c. Similarly, in the third IDT 73, the other end of the second sub-IDT portion 73b located outside in the elastic wave propagation direction is connected to the ground potential. The one end of the second sub-IDT portion 73b is connected to a common bus bar 73c.

Similarly, the second elastic wave filter unit 68 includes first to third IDTs 74 to 76 and reflectors 78a and 78b. The fourth and sixth IDTs 74 and 76 include first and second sub-IDT portions 74a and 74b and first and second sub-IDT portions 76a and 76b, respectively. The other end of the second sub-IDT portion 74b of the fourth IDT 74 located towards the inside is commonly connected to the other end of the first sub-IDT portion 76a of the sixth IDT 72 located towards the inside and is connected to the second balanced terminal 5. The one end of the second sub-IDT portion 74b and the one end of the first sub-IDT portion 76a are connected to common bus bars 74c and 76c, respectively. The other end of the first sub-IDT portion 74d located towards the outside and the other of the second sub-IDT portion 76b located towards the outside are connected to the ground potential. The one end of the first sub-IDT portion 74d and the one end of the second sub-IDT portion 76b are connected to the common bus bars 74c and 76c, respectively.

Consequently, similar to the third preferred embodiment, according to the fourth preferred embodiment, since each of the first and second elastic wave filter units 67 and 68 has a bilaterally symmetrical structure, unwanted ripples rarely occur in the passband. In addition, when the impedance of the unbalanced terminal is about 50Ω, the impedance on the side of the balanced terminals 4 and 5 can be set in the range from about 400Ω to about 1200Ω.

Figure 7:
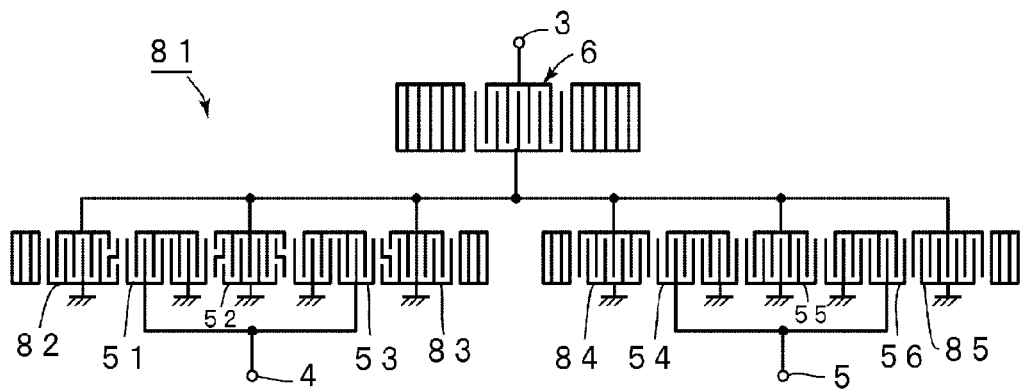
FIG. 7 is a schematic plan view of the electrode structure of a modification of the elastic wave filter device according to the third preferred embodiment of the present invention.

An elastic wave filter device 81 shown in FIG. 7 corresponds to a modification of the elastic wave filter device 41 according to the third preferred embodiment. In the elastic wave filter device 81, seventh and eighth IDTs 82 and 83 are further provided on either side of the first to third IDTs 51 to 53 in the elastic wave propagation direction. In addition, in the second elastic wave filter unit, ninth and tenth IDTs 84 and 85 are further provided on either side of the fourth to sixth IDTs 54 to 56 in the elastic wave propagation direction. The remaining structure is similar to that of the elastic wave filter device 41 according to the third preferred embodiment. Here, one end of the seventh IDT 82 and one end of the eighth IDT 83 are commonly connected to one end of the second IDT 52 and are connected to the unbalanced terminal 3. The other end of the seventh IDT 82 and the other end of the eighth IDT 83 are connected to the ground potential. Similarly, in the second elastic wave filter unit, one end of the ninth IDT 84 and one end of the tenth IDT 85 are commonly connected to one end of the fifth IDT 55 and are connected to the unbalanced terminal 3. The other end of the IDT 84 and the other end of the IDT 85 are connected to the ground potential.

In this manner, two additional IDTs may preferably be added to the first to third IDTs 51 to 53, and two additional IDTs may preferably be added to the fourth to sixth IDTs 54 to 56 of the elastic wave filter device 41 according to the third preferred embodiment so as to form 5-IDT longitudinally coupled resonator type elastic wave filter units. By using 5-IDT longitudinally coupled resonator type elastic wave filter units, first and second elastic wave filter units may be provided.

Figure 8:
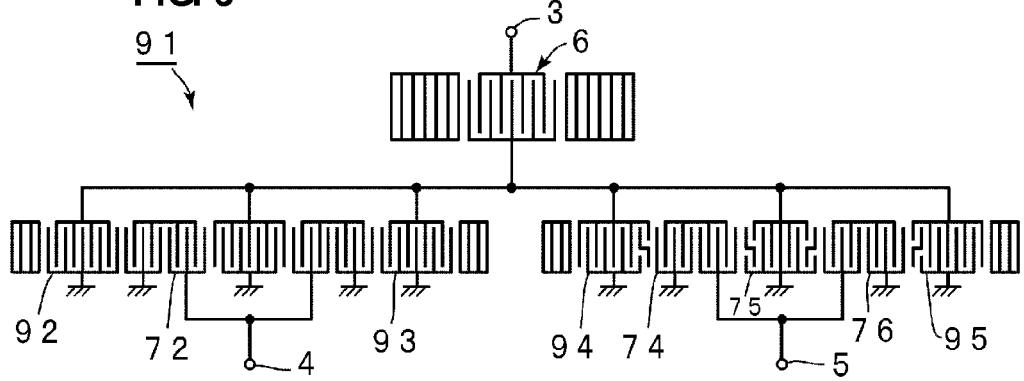
FIG. 8 is a schematic plan view of the electrode structure of a modification of the elastic wave filter device according to the fourth preferred embodiment of the present invention.

FIG. 8 is a schematic plan view of an elastic wave filter device corresponding to a modification of the elastic wave filter device 61 according to the fourth preferred embodiment. Similar to the elastic wave filter device 81 shown in FIG. 7, according to the present preferred embodiment, in an elastic wave filter device 91, a first elastic wave filter unit includes seventh and eighth IDTs 92 and 93, and a second elastic wave filter unit includes ninth and tenth IDTs 94 and 95. One end of the seventh IDT 92 and one end of the eighth IDT 93 are commonly connected to one end of the second IDT 72 and are connected to the unbalanced terminal 3. Similarly, in the second elastic wave filter unit, one end of the ninth IDT 94 and one end of the tenth IDT 95 are commonly connected to one end of a fifth IDT 75 and are connected to the unbalanced terminal 3.

As described above, in the elastic wave filter device 61 according to the fourth preferred embodiment, the first and second elastic wave filter units may be defined by 5-IDT longitudinally coupled resonator type elastic wave filter units.

It should be noted that the piezoelectric substrate used in the above-described surface acoustic wave filter devices is not limited to a 40±5° Y-cut X-propagating LiTaO$_3$ substrate. For example, a LiTaO$_3$ substrate having a different crystal orientation may be used. Furthermore, a variety of LiNbO$_3$ substrates, such as a 64°-72° Y-cut X-propagating LiNbO$_3$ substrate and a 41° Y-cut X-propagating LiNbO$_3$ substrate, may be used.

In addition, while the above-described first to fourth preferred embodiments and the modifications thereof have been described with reference to surface acoustic wave filter devices including the electrode structures provided on a piezoelectric substrate, as shown in the drawings, the present invention may be a boundary elastic wave filter device having the above-described electrode structure provided on the boundary between a piezoelectric substance and a dielectric substance. That is, the elastic wave filter devices according to preferred embodiments of the present invention can be applied to not only surface acoustic wave filter devices but also boundary elastic wave filter devices. As used herein, the term "elastic waves" refers to as not only surface acoustic waves but also to other elastic waves, such as boundary elastic waves.

Figure 9:
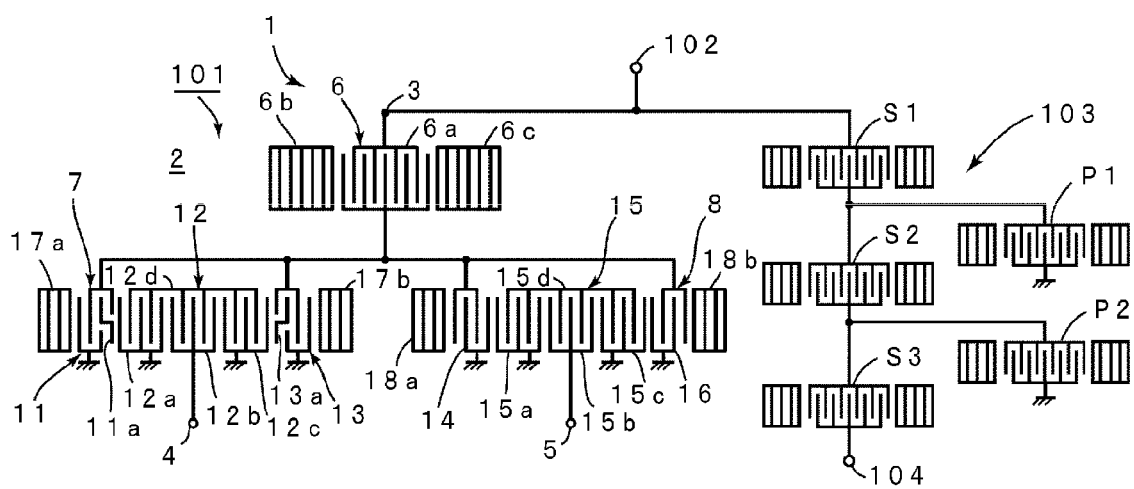
FIG. 9 is a schematic plan view of the electrode structure of a duplexer according to another preferred embodiment of the present invention.
Figure 10:
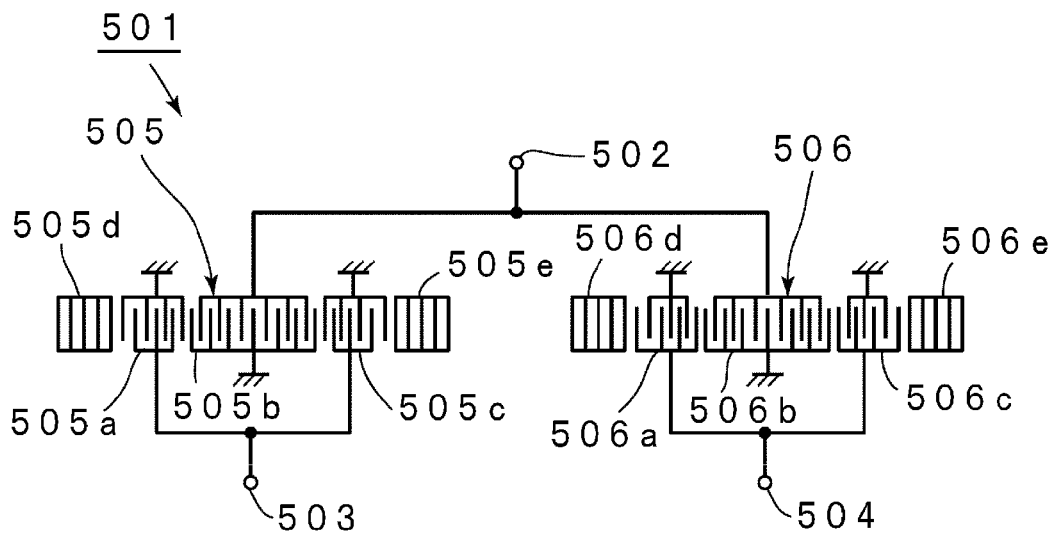
FIG. 10 is a plan view schematically illustrating the electrode structure of an existing elastic wave filter device.

According to preferred embodiments of the present invention, the elastic wave filter device can be used for a variety of bandpass filters. In addition, the elastic wave filter device can be appropriately used for a duplexer in the RF stage of cell phones. FIG. 9 is a schematic plan view of the electrode structure of a duplexer according to a preferred embodiment of the present invention. A duplexer 101 includes an antenna terminal 102. The elastic wave filter device 1 according to the first preferred embodiment is preferably connected to the antenna terminal 102, for example. That is, the unbalanced terminal of the elastic wave filter device 1 is connected to the antenna terminal 102.

The elastic wave filter device 1 is used as a reception band filter in the duplexer 101. The first and second balanced terminal 4 and 5 of the elastic wave filter device 1 are connected to a balanced mixer IC arranged downstream.

A transmission band filter 103 is further connected to the antenna terminal 102. The transmission band filter 103 is an elastic wave filter device having a ladder circuit arrangement. The transmission band filter 103 includes a plurality of serial-branch resonators S1 to S3 and parallel-branch resonators P1 and P2. As described above, one end of the transmission band filter 103 is connected to the antenna terminal 102, and the other end defines a transmission terminal 104.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A balanced elastic wave filter device having an unbalanced terminal and first and second balanced terminals, comprising:

a first elastic wave filter unit including first to third IDTs arranged in this order in an elastic wave propagation direction, the second IDT being divided into three portions in the elastic wave propagation direction so as to include first to third sub-IDT portions; and a second elastic wave filter unit including fourth to sixth IDTs arranged in this order in an elastic wave propagation direction, the fifth IDT being divided into three portions in the elastic wave propagation direction so as to include first to third sub-IDT portions; wherein one end of the first IDT, one end of the third IDT, one end of the fourth IDT, and one end of the sixth IDT are connected to the unbalanced terminal;

the first to third IDTs and the fourth to sixth IDTs are arranged such that a phase of a signal transmitted from the unbalanced terminal to the first balanced terminal is different from a phase of a signal transmitted from the unbalanced terminal to the second balanced terminal by about 180 degrees;

the second IDT includes a first common bus bar that commonly connects one end of each of the first to third sub-IDT portions together, the other end of the second sub-IDT portion is connected to the first balanced terminal, the other end of the first sub-IDT portion and the other end of the third sub-IDT portion are connected to a ground terminal; and the fifth IDT includes a second common bus bar that commonly connects one end of each of the first to third sub-IDT portions together, the other end of the second sub-IDT portion is connected to the second balanced terminal, and the other end of the first sub-IDT portion and the other end of the third sub-IDT portion are connected to a ground terminal.

2. A duplexer comprising:

the elastic wave filter device according to claim 1 used for a reception filter; and a filter having a ladder circuit configuration used for a transmission filter.

3. A balanced elastic wave filter device having an unbalanced terminal and first and second balanced terminals, comprising:

a first elastic wave filter unit including first to third IDTs arranged in this order in an elastic wave propagation direction, the second IDT being divided into three portions in the elastic wave propagation direction so as to include first to third sub-IDT portions; and a second elastic wave filter unit including fourth to sixth IDTs arranged in this order in an elastic wave propagation direction, the fifth IDT being divided into three portions in the elastic wave propagation direction so as to include first to third sub-IDT portions; wherein one end of the first IDT, one end of the third IDT, one end of the fourth IDT, and one end of the sixth IDT are connected to the unbalanced terminal;

the first to third IDTs and the fourth to sixth IDTs are arranged such that a phase of a signal transmitted from the unbalanced terminal to the first balanced terminal is different from a phase of a signal transmitted from the unbalanced terminal to the second balanced terminal by about 180 degrees;

the second IDT includes a first common bus bar that commonly connects the first to third sub-IDT portions together, an end of the first sub-IDT portion and an end of the third sub-IDT portion of the second IDT that are ends opposite to the ends connected to the first common bus bar are connected to the first balanced terminal, and an end of the second sub-IDT portion that is an end opposite to the end connected to the first common bus bar is connected to a ground terminal; and the fifth IDT includes a second common bus bar that commonly connects one end of each of the first to third sub-IDT portions together, an end of the first sub-IDT portion and an end of the third sub-IDT portion of the fifth IDT that are ends opposite to the ends connected to the second common bus bar are connected to the second balanced terminal, and an end of the second sub-IDT portion that is an end opposite to the end connected to the first common bus bar is connected to a ground terminal.

4. A duplexer comprising:
the elastic wave filter device according to claim 3 used for a reception filter; and
a filter having a ladder circuit configuration used for a transmission filter.

5. A balanced elastic wave filter device having an unbalanced terminal and first and second balanced terminals, comprising:
a first elastic wave filter unit including first to third IDTs arranged in this order in an elastic wave propagation direction, each of the first and third IDTs being divided into two portions in the elastic wave propagation direction so as to include first and second sub-IDT portions; and
a second elastic wave filter unit including fourth to sixth IDTs arranged in this order in an elastic wave propagation direction, each of the fourth and sixth IDTs being divided into two portions in the elastic wave propagation direction so as to include first and second sub-IDT portions; wherein
one end of the second IDT and one end of the fifth IDT are connected to the unbalanced terminal;
the first, third, fourth, and sixth IDTs respectively include first to fourth common bus bars that commonly connect one end of the first sub-IDT portion to one end of the second sub-IDT portion;
the other end of the first sub-IDT portion of the first IDT is commonly connected to the other end of the second sub-IDT portion of the third IDT and is connected to the first balanced terminal, and the other end of the first sub-IDT portion of the fourth IDT is commonly connected to the other end of the second sub-IDT portion of the sixth IDT and is connected to the second balanced terminal;
the other end of the second sub-IDT portion of the first IDT, the other end of the first sub-IDT portion of the third IDT, the other end of the second sub-IDT portion of the fourth IDT, and the other end of the first sub-IDT portion of the sixth IDT are connected to a ground terminal;
the first to sixth IDTs are arranged such that a phase of a signal transmitted from the unbalanced terminal to the first balanced terminal is different from a phase of a signal transmitted from the unbalanced terminal to the second balanced terminal by about 180 degrees.

6. The elastic wave filter device according to claim 5, further comprising:
seventh and eighth IDTs disposed on either side of an area in which the first to third IDTs are disposed in the elastic wave propagation direction; and
ninth and tenth IDTs disposed on either side of an area in which the fourth to sixth IDTs are disposed in the elastic wave propagation direction; wherein
one end of the seventh IDT, one end of the eighth IDT, one end of the ninth IDT, and one end of the tenth IDT are connected to the unbalanced signal terminal.

7. A duplexer comprising:
the elastic wave filter device according to claim 5 used for a reception filter; and
a filter having a ladder circuit configuration used for a transmission filter.

8. A balanced elastic wave filter device having an unbalanced terminal and first and second balanced terminals, comprising:
a first elastic wave filter unit including first to third IDTs arranged in this order in an elastic wave propagation direction, each of the first and third IDTs being divided into two portions in the elastic wave propagation direction so as to include first and second sub-IDT portions; and
a second elastic wave filter unit including fourth to sixth IDTs arranged in this order in an elastic wave propagation direction, each of the fourth and sixth IDTs being divided into two portions in the elastic wave propagation direction so as to include first and second sub-IDT portions; wherein
one end of the second IDT and one end of the fifth IDT are connected to the unbalanced terminal;
the first, third, fourth, and sixth IDTs respectively include first to fourth common bus bars that commonly connect one end of the first sub-IDT portion to one end of the second sub-IDT portion;
the other end of the second sub-IDT portion of the first IDT is commonly connected to the other end of the first sub-IDT portion of the third IDT and is connected to the first balanced terminal, and the other end of the second sub-IDT portion of the fourth IDT is commonly connected to the other end of the first sub-IDT portion of the sixth IDT and is connected to the second balanced terminal;
the other end of the first sub-IDT portion of the first IDT, the other end of the second sub-IDT portion of the third IDT, the other end of the first sub-IDT portion of the fourth IDT, and the other end of the second sub-IDT portion of the sixth IDT are connected to a ground terminal; and
the first to sixth IDTs are arranged such that a phase of a signal transmitted from the unbalanced terminal to the first balanced terminal is different from a phase of a signal transmitted from the unbalanced terminal to the second balanced terminal by about 180 degrees.

9. The elastic wave filter device according to claim 8, further comprising:
seventh and eighth IDTs disposed on either side of an area in which the first to third IDTs are disposed in the elastic wave propagation direction; and
ninth and tenth IDTs disposed on either side of an area in which the fourth to sixth IDTs are disposed in the elastic wave propagation direction; wherein
one end of the seventh IDT, one end of the eighth IDT, one end of the ninth IDT, and one end of the tenth IDT are connected to the unbalanced signal terminal.

10. A duplexer comprising:
the elastic wave filter device according to claim 8 used for a reception filter; and
a filter having a ladder circuit configuration used for a transmission filter.

* * * * *